US008538032B2

(12) United States Patent
Woelfl et al.

(10) Patent No.: US 8,538,032 B2
(45) Date of Patent: Sep. 17, 2013

(54) ELECTRICAL LOAD DETECTION APPARATUS

(75) Inventors: Genaro Woelfl, Straubing (DE); Arnold Knott, Steinach (DE); Michael Gueth, Kaelberfeld (DE)

(73) Assignee: Harman Becker Automotive Systems GmbH, Karlsbad (DE)

( * ) Notice: Subject to any disclaimer, the term of this patent is extended or adjusted under 35 U.S.C. 154(b) by 747 days.

(21) Appl. No.: 12/431,368

(22) Filed: Apr. 28, 2009

(65) Prior Publication Data

US 2010/0019781 A1 Jan. 28, 2010

(30) Foreign Application Priority Data

Apr. 28, 2008 (EP) .................................... 08008141

(51) Int. Cl.
*G01R 27/08* (2006.01)

(52) U.S. Cl.
USPC ............... 381/59; 381/58; 324/555; 324/691; 324/713

(58) Field of Classification Search
USPC ................................ 381/58, 59, 96, 111, 400
See application file for complete search history.

(56) References Cited

U.S. PATENT DOCUMENTS 6,812,715 B2 * 11/2004 Chiozzi et al. ................ 324/691
2002/0149424 A1 * 10/2002 Honda ....................... 330/207 A
2004/0008848 A1 * 1/2004 Krochmal et al. .............. 381/55
2004/0122541 A1 * 6/2004 DiSanza et al. ................. 700/94
2005/0175195 A1 * 8/2005 Cheney et al. ................ 381/120
2006/0126857 A1 6/2006 Pavlov et al.
2007/0057720 A1 3/2007 Hand et al.
2008/0288190 A1 * 11/2008 Wang et al. ..................... 702/59
2009/0051368 A1 * 2/2009 Knott ............................ 324/555
2009/0274312 A1 * 11/2009 Howard et al. ................. 381/58

FOREIGN PATENT DOCUMENTS

DE 19612891 10/1997 .......................... 31/2
DE 19712571 6/1998
EP 2120485 11/2009
WO WO9720221 6/1997

* cited by examiner

*Primary Examiner* — Minh-Loan T Tran
*Assistant Examiner* — Fazli Erdem
(74) *Attorney, Agent, or Firm* — O'Shea Getz P.C.

(57) ABSTRACT

A load detection technique for a load comprising multiple frequency-dependant sub-loads comprises measuring a representation of the impedance characteristic of the load; providing stored representations of a multiplicity of impedance characteristics of the load; each one of the stored representations represents the impedance of the load when at least a particular one of the sub-loads is in a fault condition; and comparing the measured representation of the current impedance characteristic of the load with each one of the stored representations and in case that the measured representation matches a stored representation, identifying the sub-load or sub-loads being in a fault condition by the corresponding stored representation.

16 Claims, 14 Drawing Sheets

| Gain_f1 < MaxGain | Gain_f2 < MaxGain | Gain_f1 − Gain_f2 > Detection Threshold | Tweeter Connected | Midrange Connected |
|---|---|---|---|---|
| NO | NO | X | NO | NO |
| NO | YES | X | YES | NO |
| YES | YES | NO | NO | YES |
| YES | YES | YES | YES | YES |

FIG. 8

ELECTRICAL LOAD DETECTION APPARATUS

CLAIM OF PRIORITY

This patent application claims priority to European Patent Application serial number 08 008 141.7 filed on Apr. 28, 2008.

FIELD OF TECHNOLOGY

The invention relates to a load detection for a load comprising multiple frequency-dependant sub-loads and evaluating a load comprising multiple frequency-dependant sub-loads.

RELATED ART

During audio system assembly in automobile manufacturing lines and in audio system checks performed in repair shops, it is necessary to test the interconnection between the amplifier and loudspeakers of the audio system to ensure the quality of the audio system. Various wiring problems can be experienced including failure to properly join the harness wiring to the loudspeaker terminals, bent or broken terminals, and pinched or broken wires in the harness.

Existing speaker detection techniques include what is known as a speaker walk-around test, wherein the audio system is placed into a test mode in which it sequentially sends an output audio signal individually to each loudspeaker while a person listens to determine if proper sound comes from each loudspeaker. However, this procedure is time consuming and it is difficult for the listener to detect a single loudspeaker in the presence of noise.

It is also known to employ each loudspeaker as a pick-up or microphone to generate a signal for sensing the presence of a properly connected loudspeaker. By forcibly moving a loudspeaker cone, a voltage is created across the loudspeaker. But since a loudspeaker is not optimized to perform as a pick-up, a high sound-pressure level is required to generate a detectible signal (e.g., by slamming a door). However, this method is also time consuming and is not reliable since it is difficult to identify the output signal of a particular loudspeaker under investigation since woofers, midrange speakers, and tweeters are commonly coupled to each other by a crossover network.

Furthermore, the prior art methods are not well adapted for detecting intermittent speaker connection problems after a vehicle is put into service since they require interaction by a human test operator.

Therefore, there is a need for automatically detecting of faults in different loudspeakers of a loudspeaker system.

SUMMARY OF THE INVENTION

A load detection arrangement for a load comprising multiple frequency-dependant sub-loads comprises an impedance measuring unit that is connected to the load and measures a representation of the impedance characteristic of the load; an evaluation unit that calculates a quantity representing the shape of the impedance characteristic of the load, the quantity being insusceptible to frequency independent errors and/or tolerances; a memory unit in which one or more representations of the quantity representing the shape of the impedance characteristic of the load resulting from different configurations of the sub-loads are stored; and a comparison unit that is connected to the evaluation unit to receive a representation of the shape of the currently measured impedance characteristic of the load and to the memory unit to receive the stored representations. The comparison unit compares the measured representation of the shape with each one of the stored representations and, in case that the measured representation matches a stored representation, to identify the configuration of the sub-loads within the load.

DESCRIPTION OF THE DRAWINGS

The invention can be better understood with reference to the following drawings and description. The components in the figures are not necessarily to scale, instead emphasis being placed upon illustrating the principles of the invention. Moreover, in the figures, like reference numerals designate corresponding parts. In the drawings:

FIG. 8 shows a truth table used for load detection in connection with the technique illustrated in FIG. 7;

DETAILED DESCRIPTION

Figure 1:
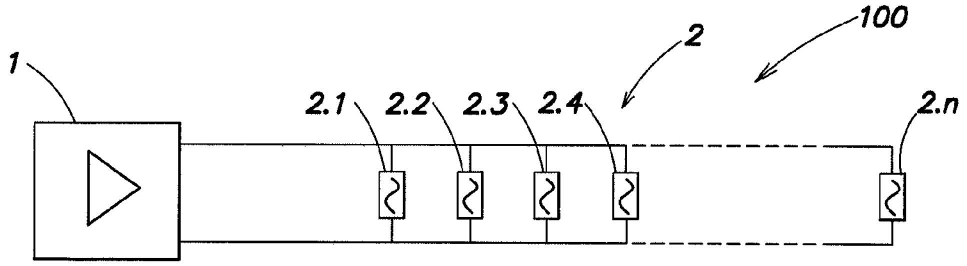
FIG. 1 is a block diagram illustration of a signal generator having a load comprising parallel connected sub-loads.

FIG. 1 is a block diagram illustration of an arrangement 100 (e.g., an audio system) comprising a signal source 1 (e.g., an audio amplifier) supplying an electrical signal to a load 2 that comprises n sub-loads 2.1 to 2.$n$ (e.g., loudspeakers) connected in parallel. Each of the sub-loads 2.1 to 2.$n$ has a frequency-dependant impedance characteristic $Z_i(f)$ with i=1 . . . n and f=frequency. The impedance $Z_{total}(f)$ of the load 2 is:

$$Z_{total}(f)=1/(1/Z_1(f)+1/Z_2(f)+\ldots+1/Z_n(f))$$

Figure 2:
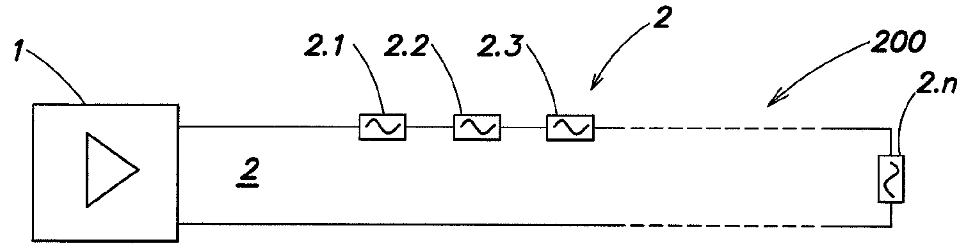
FIG. 2 is a block diagram illustration of an audio system having a load comprising serial connected sub-loads.

FIG. 2 illustrates an alternative arrangement 200 that differs from the embodiment illustrated in FIG. 1 in that the n sub-loads 2.1 to 2.$n$ of the load 2 are connected in series. The impedance $Z_{total}(f)$ of the load 2 in the arrangement of FIG. 2 is:

$$Z_{total}(f)=Z_1(f)+Z_2(f)+\ldots+Z_n(f).$$

The load 2 may also be a combination of series and parallel connected sub-loads as discussed below with reference to FIG. 3. The novel approach is able to detect in case of a parallel connection (FIG. 1) whether any of the sub-loads 2.1 to 2.$n$ is missing (open) or not, and in case of a series connection (FIG. 2) whether any of the sub-loads is shorted or not. In both cases, each of the sub-loads can be detected independent of all other loads. In the case of parallel and series sub-loads (FIG. 3), the term "open" applies to sub-loads connected in parallel and "short circuit" applies to sub-loads in series.

Figure 3:
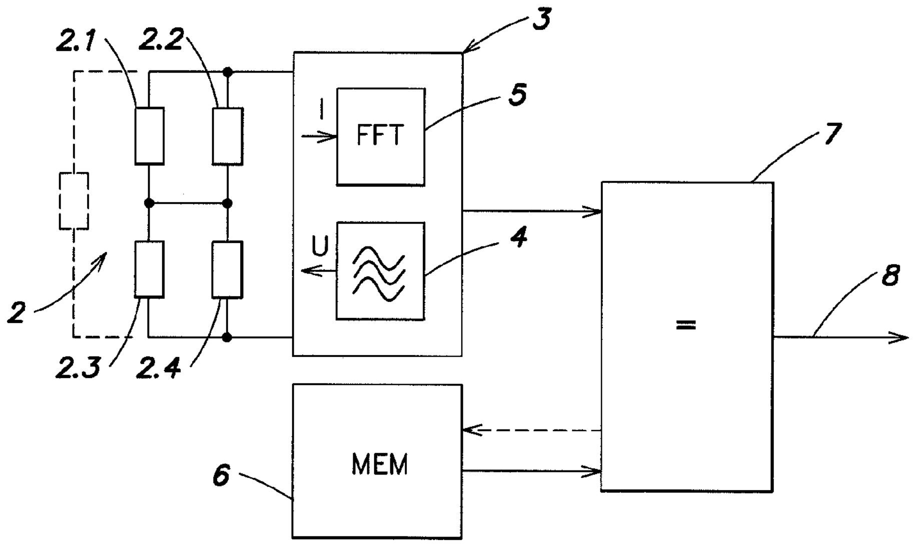
FIG. 3 is a block diagram illustration of a load detection arrangement using a broadband test signal.

Referring to FIG. 3, the load 2 comprises, for example, four sub-loads 2.1 (e.g., a low-range loudspeaker), 2.2 (e.g., a capacitor), 2.3 (e.g., a mid-high-range loudspeaker), and 2.4 (e.g., an inductance). The sub-loads 2.1 and 2.2 are connected in parallel as well and the sub-loads 2.3 and 2.4 are connected in parallel. Furthermore, the parallel connected sub-loads 2.1 and 2.2 and the parallel connected sub-loads 2.3 and 2.4 are connected in series forming a kind of H-circuit which is represented by the load 2. This H-circuit is connected to an impedance measuring unit 3 and adapted to measure a representation of the impedance characteristic of the load 2. The impedance measuring unit 3 comprises in the present example a test signal source 4 providing test signal comprising, e.g., a plurality of simultaneously transmitted sinusoidal voltages each with a certain, e.g., the same, amplitude (or, alternatively, a broadband white noise signal). The impedance measuring unit 3 further comprises a Fast-Fourier transformation (FFT) unit 5 that performs an FFT on the current flowing through the load 2 in order to provide an impedance characteristic as an impedance curve over frequency. The impedance characteristic may be represented by at least two data words (e.g., 512 pairs of data words) where one of the data words refers to a frequency value and the other to the respective impedance value. The measurement result (i.e., the impedance-over-frequency-curve) is used to calculate a quantity representing the shape of the impedance curve. Therefore, the measurement unit 3 comprises an evaluation unit that is configured to calculate a quantity representing the shape of the impedance characteristic of the load, whereby the quantity is insusceptible to frequency independent errors and/or tolerances. Such quantities may be, for example, the slope of the curve at given frequencies or the area between the curve and a threshold line defining a threshold impedance at a pre-defined frequency.

In a memory unit 6 representations of the mentioned quantity representing the shape of the impedance characteristics of the load are stored. Each one of the stored quantities represents the shape of the impedance curve over frequency of the load 2 when at least a particular one of the sub-loads 2.1, 2.2, 2.3, and 2.4 is in a fault condition. Assuming that each sub-load can be in one of three conditions, "ok", "open", and "short circuit" and having, in the exemplary arrangement of FIG. 3, four sub-loads, the number of representations of the quantity stored is $3^4=81$. This number corresponds to 81 different configurations of the sub-loads within the load or to the so-called load situations including one representing a proper condition of the load 2. Accordingly, 80 representations of the shape-quantity (excluding the situation of a proper load) or 81 representations of the shape-quantity (including the situation of a proper load) may be stored in the memory unit 6. In order to get a fast result if the load is in a proper condition or in a fault condition the arrangement may first (or only) check if the shape-quantity representing a proper condition is met. In case it does not the sub-load being in a fault condition may be identified afterwards if desired.

The arrangement of FIG. 3 further comprises a comparison unit 7 that is connected to the impedance measuring unit 3 (and thus to the evaluation unit) to receive a representation of the shape of the currently measured impedance characteristic of the load 2 and to the memory unit 6 to receive the stored representations. The comparison unit 7 compares the measured representation with each one of the stored shape-quantities and in case the measured representation matches one of the stored 80 representations corresponding to fault situations it distinctly identifies the sub-load or sub-loads being in a fault condition by the stored 80 representations. In case 81 representations are used it may also identify the proper-load situation. The results are provided by an output signal 8 identifying the sub-load or sub-loads being in a fault condition.

In the exemplary arrangement shown in FIG. 3 the test signal comprises a multiplicity of simultaneously transmitted sinusoidal voltages. However, the multiplicity of sinusoidal voltages may be transmitted sequentially instead of simultaneously. Sequentially transmitted sinusoidal voltages are used in the arrangements shown in FIGS. 4 and 5.

Figure 4:
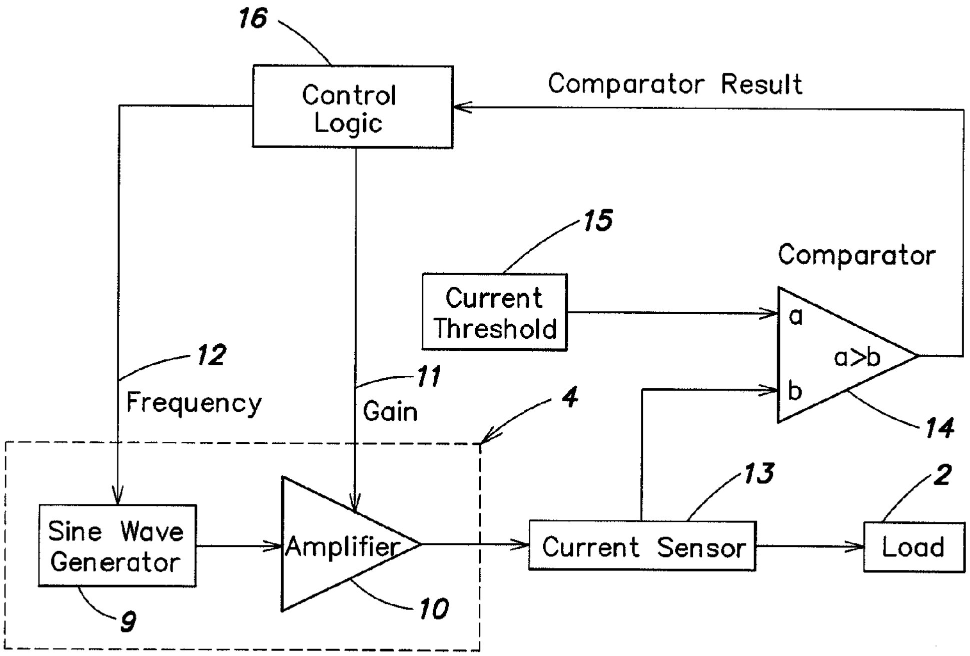
FIG. 4 is a block diagram illustration of a load detection arrangement using a sequence of narrowband test signals and a comparator.

In the arrangement of FIG. 4, a sine wave generator 9 and an audio amplifier 10 together form the test signal source 4. The audio amplifier 10 may be the same used in the regular mode for amplifying the useful signals such as music or speech, and has a volume control line 11 to control the volume of a signal supplied to its input. In the test mode, the sine wave generator 9 is connected to this input to provide a sinusoidal signal with a certain frequency that is controllable by a signal on a frequency control line 12. The audio amplifier 10 provides a sinusoidal voltage to the load 2 via a current sensor 13 measuring the current flowing through the load 2. Instead of a current sensor a voltage sensor may be used in case that the test signal source provides a test current. A representation of the measured current is supplied to a comparator 14 that compares this representation with a threshold 15 representing a current threshold. The result of the comparison is supplied to a control logic unit 16 that is connected to the sine wave generator 9 and the audio amplifier 10 through the frequency control line 12 and the volume control line 11, respectively, for providing the respective control signals.

The control logic unit 16 controls the frequency and the signal amplitude of the test signal. The current sensor 13 measures the current that flows into the load 2 and the comparator 14 compares the measured current with the threshold 15. At each test frequency, the amplifier gain starts at a value where the load current is less than the threshold and is increased in steps that are sufficiently small with respect to the expected load variations for all possible load combinations. When the load current at the given frequency becomes higher than the current threshold for the first time, the corresponding impedance value can be calculated from the current threshold, the output amplitude of the sine wave generator 9 and the amplifier gain. For the following analysis the impedance value itself is not needed and the gain value is sufficient. The gain value for all other test frequencies is determined in the same way.

Figure 5:
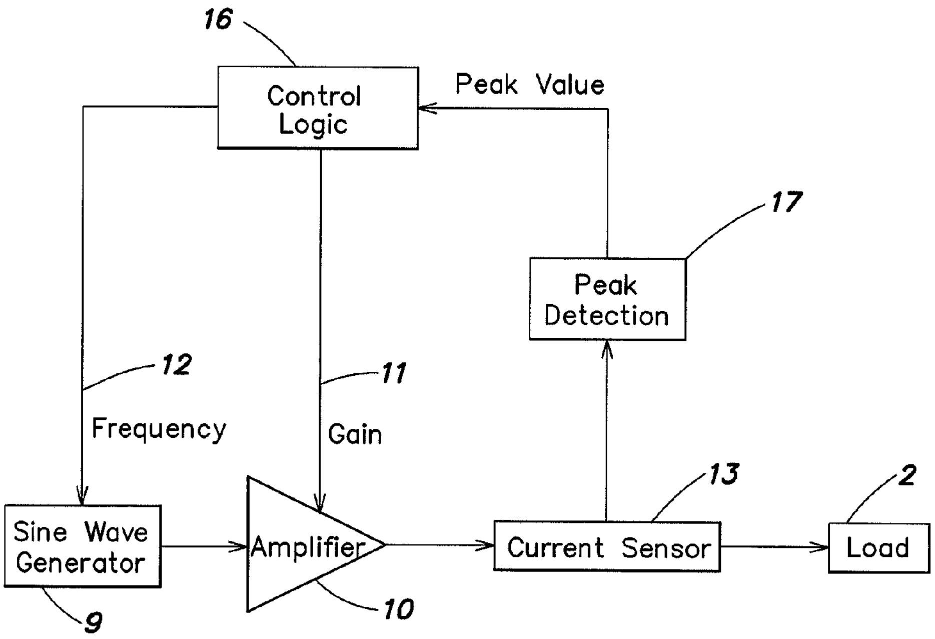
FIG. 5 is a block diagram illustration of a load detection arrangement using a sequence of narrowband test signals and a peak detector.

The arrangement of FIG. 5 differs from that shown in FIG. 4 in that the comparator 14 in connection with threshold 15 is substituted by a peak detector 17. Here, the gain of the audio amplifier 10 does not need to be varied. Instead, the impedance of the load 2 is calculated from the sine wave generator output, the (constant) amplifier gain and the peak current determined by the peak detector 17.

Figure 6:
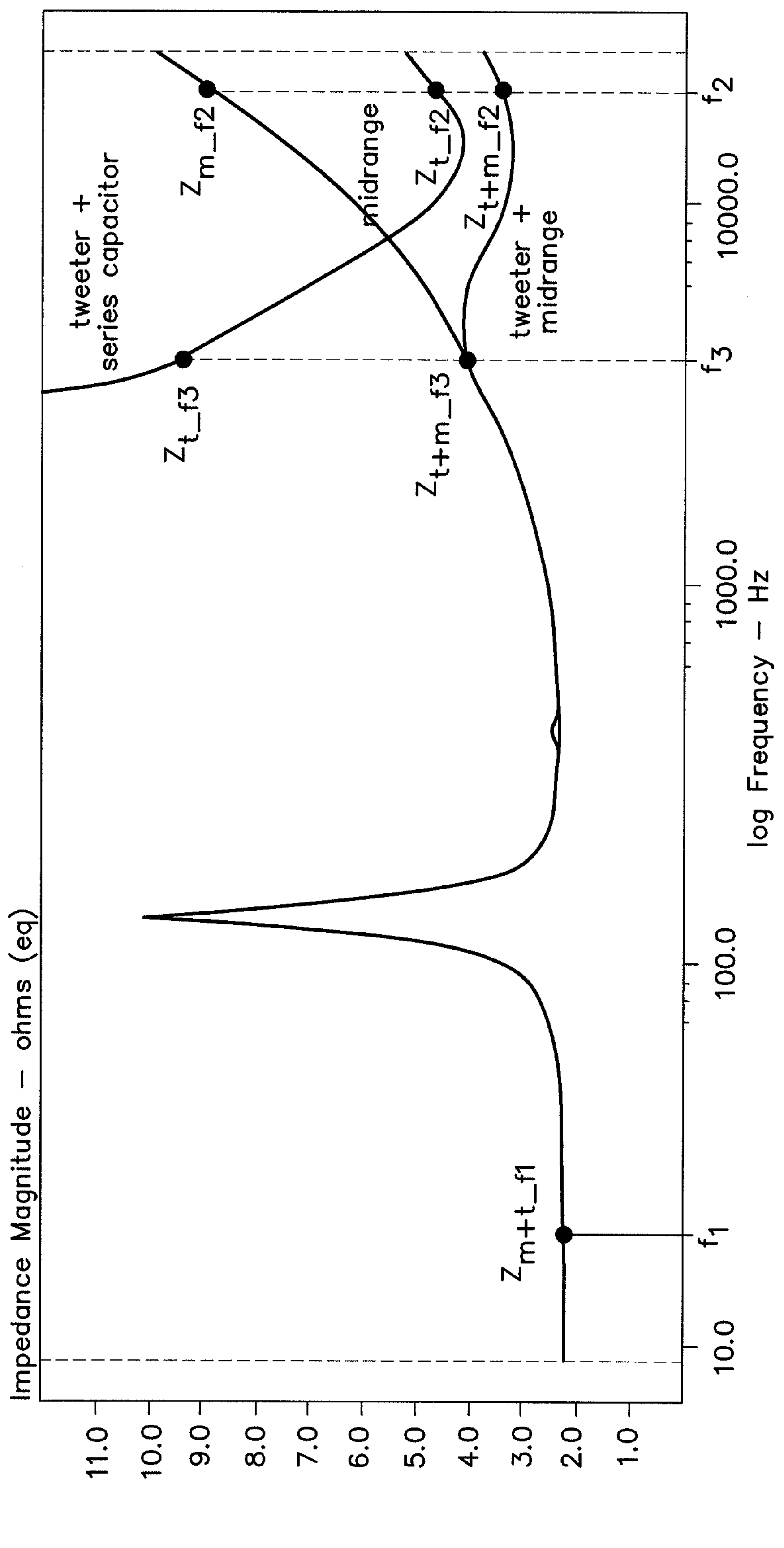
FIG. 6 is a diagram illustrating a load impedance curve over frequency.
Figure 7:
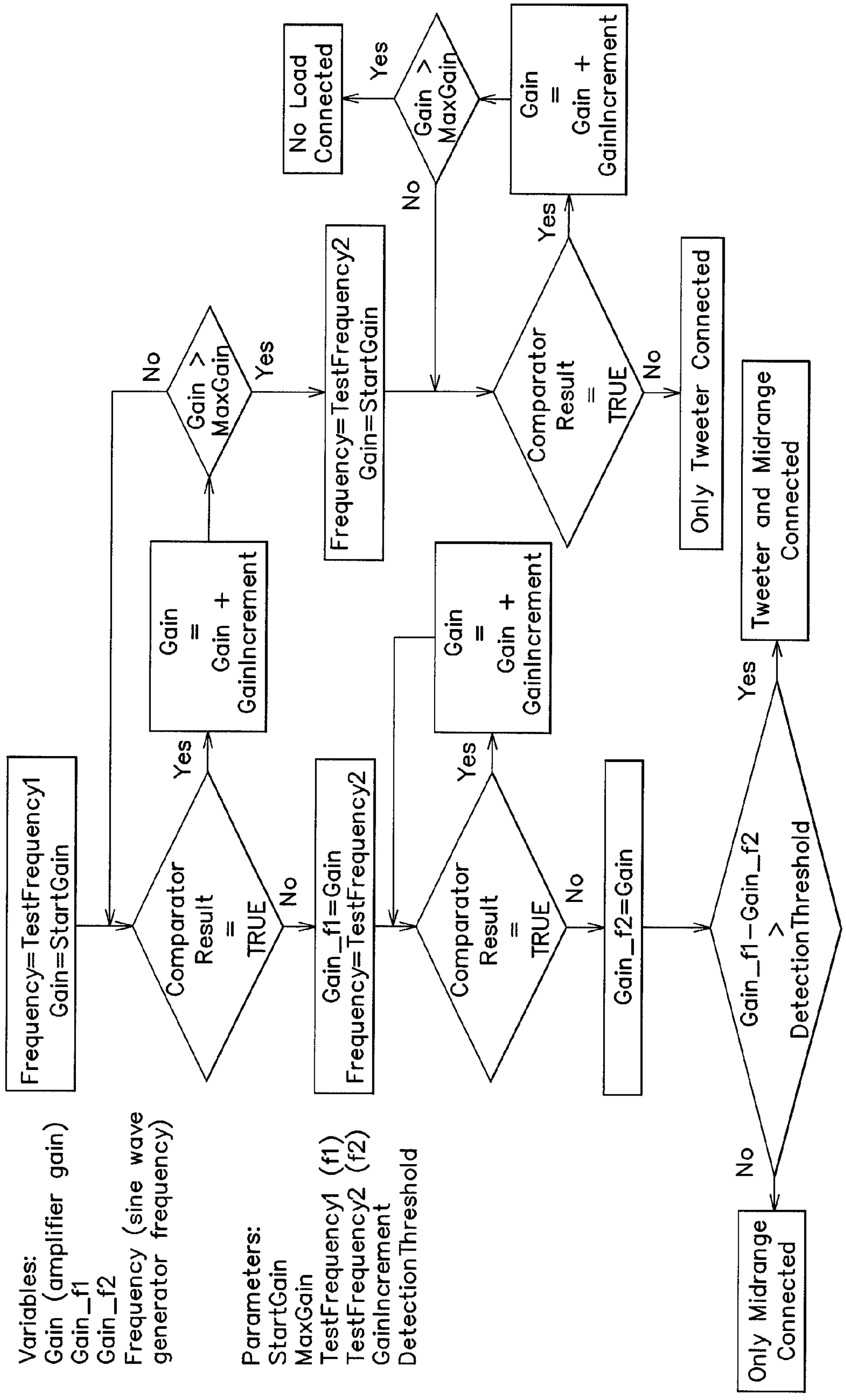
FIG. 7 is a flow chart illustration of an example of a novel load detection technique.

With reference to FIGS. 6 and 7, an example is discussed how the control logic unit 16 in the arrangement of FIG. 4 controls the process of identifying sub-loads in a fault condition. FIG. 7 illustrates a process that is used to analyze the load combinations of FIG. 6. Tweeters and (bass-) midrange loudspeakers coupled by a passive crossover network are commonly used in multi-channel car audio systems. Commonly used amplifiers and loads, e.g., loudspeakers in connection with passive components such as inductors and capacitors, tend to have large tolerances as well as the measurement systems which are supposed to be low-cost.

However, most of these tolerances are frequency independent so that the absolute impedance values measured may change, but not the shape of the impedance curves. Accordingly, the shape of the curve may be used to differentiate all possible load combinations despite all frequency independent system tolerances. The shape may be, for example, characterized by the slope of the curve at given frequency values or by the area under the curve. By considering such characteristic values representing the shape of the impedance curve (but not the absolute impedance values) the load detection may be designed to be more robust against tolerances. The process discussed with reference to FIG. 7 is explained as a first example that uses the lowest possible frequency resolution of only two test frequencies for impedance measurements. As the involved sub-loads show substantial variations in the shape of the impedance curve when one or more sub-loads are missing or in short circuit state, this resolution is sufficient in the present example. Accordingly, a representation of the shape of the curve is considered not the curve itself, i.e., not the absolute impedance values. Sub-load combinations of higher complexity may require the use of a considerably higher number of test frequencies.

In the example of FIG. 7 based on the arrangement of FIG. 4, the rough shape of the impedance curve of FIG. 6 is used to analyze the load 2. The shape of the impedance curve is thereby roughly represented by the slope of the curve, whereby the slope is approximated by the difference between two impedance values $Z(f_1)-Z(f_2)$. At first the required gain of the audio amplifier 10 is determined to get a load current higher than the current threshold at test frequency $f_1$ which may be 20 Hz. Therefore, the gain (Gain) which starts at a known value in order to result in a load current lower than the current threshold for all possible tolerances (StartGain) is increased in little steps. The gain increment depends on the gain resolution needed to differentiate all possible load combinations.

Being beyond the MaxGain point (representing maximum gain) which has to be high enough to ensure that the current threshold can be reached for all possible sub-load combinations of interest at the given frequency (which in case of $f_1$ is only the midrange including all tolerances) indicates that there is no midrange loudspeaker connected. Otherwise the result is a gain value that trips the current threshold comparator which then is stored in Gain_f1 and indicates at least the midrange loudspeaker is present. The gain value $Gain\_f_1$ is a representation of the first impedance value $Z(f_1)$. In any case the next step is to repeat the preceding procedure for the second test frequency $f_2$ which may be 20 kHz. When the current threshold has been reached in the first step the corresponding gain value can be used as the start value for the second test frequency $f_2$. Otherwise the gain is set back to the original gain StartGain. If no midrange loudspeaker is properly connected, there is the possibility to exceed the MaxGain again which indicates that the tweeter is also not connected.

If the current threshold is reached, it indicates that the tweeter is connected only. If the midrange loudspeaker has been detected at frequency $f_1$ the gain value which results in the load current to get higher than the current threshold for the first time at frequency $f_2$ is stored in Gain_f2, which is a representation of the second impedance $Z(f_2)$. Following the above elaborated idea, the difference between $Gain\_f_1$ and $Gain\_f_2$ (representing the difference $Z(f_1)-Z(f_2)$ being an approximation of the slope) is used to determine whether the tweeter is also connected. The midrange loudspeaker alone exhibits a large increase of impedance between frequencies $f_1$ and $f_2$ while the combination of midrange loudspeaker and tweeter shows only a small increase. If the impedance increase is higher than the detection threshold Detection-Threshold then the tweeter is connected. The detection threshold has to take into account all frequency dependent impedance tolerances at frequencies $f_1$ and $f_2$ of the combination of the tweeter and the midrange loudspeaker.

All decisions that have to be made during the analysis of the measurements for the load detection in this example are included in the truth table of FIG. 8. The truth table may be stored in a memory unit or, as in the present example, be hardwired in the control logic so that the control logic also has the function of a memory. The test frequencies $f_1$ and $f_2$ enable noiseless load detection as they may be adapted in frequency and/or amplitude to be inaudible for humans. If acoustical feedback for the test operator is desired for example a frequency $f_3$ (FIG. 6) may be used instead of frequencies $f_1$ or $f_2$.

An advantage of the novel arrangement and method of the present invention is the insusceptibility to frequency independent tolerances inherent to the load and the load detection system. Besides this it is based on purely electrical measurements and is fully automated therefore it saves costs and time. Since no acoustical measurements are needed, it is immune to noise and does not require microphones. But not only the sub-loads established by loudspeakers may be tested using the arrangement and method of the present invention but also the components of the cross-over network. Further, the novel arrangement and method is not restricted to audio systems but is also applicable in all fields where frequency dependent sub-loads (i.e., impedances) occur. A further advantage is that the novel arrangement and the method are relatively insusceptible to any tolerance or measurement errors occurring in the system, e.g., speaker, amplifier, comparator, et cetera.

According to another embodiment of the above discussed method of load detection based on characteristic "geometrical properties" (i.e., on the shape) of the load impedance curve the load can be analyzed by comparing the area between the impedance curve and a specific impedance base line over a specified frequency range to representations of this area for different load situations.

One advantage over the example of FIGS. 7 and 8, where only the difference between two frequencies (as an approximation of the slope) is analyzed, can be seen in the still lower susceptibility to tolerances of the load and of the measurement. Another benefit of this embodiment is an increased measurement accuracy that is achieved by multiple measurements at different frequencies. In this way dynamic errors that change between measurements will be suppressed by averaging.

Figure 9:
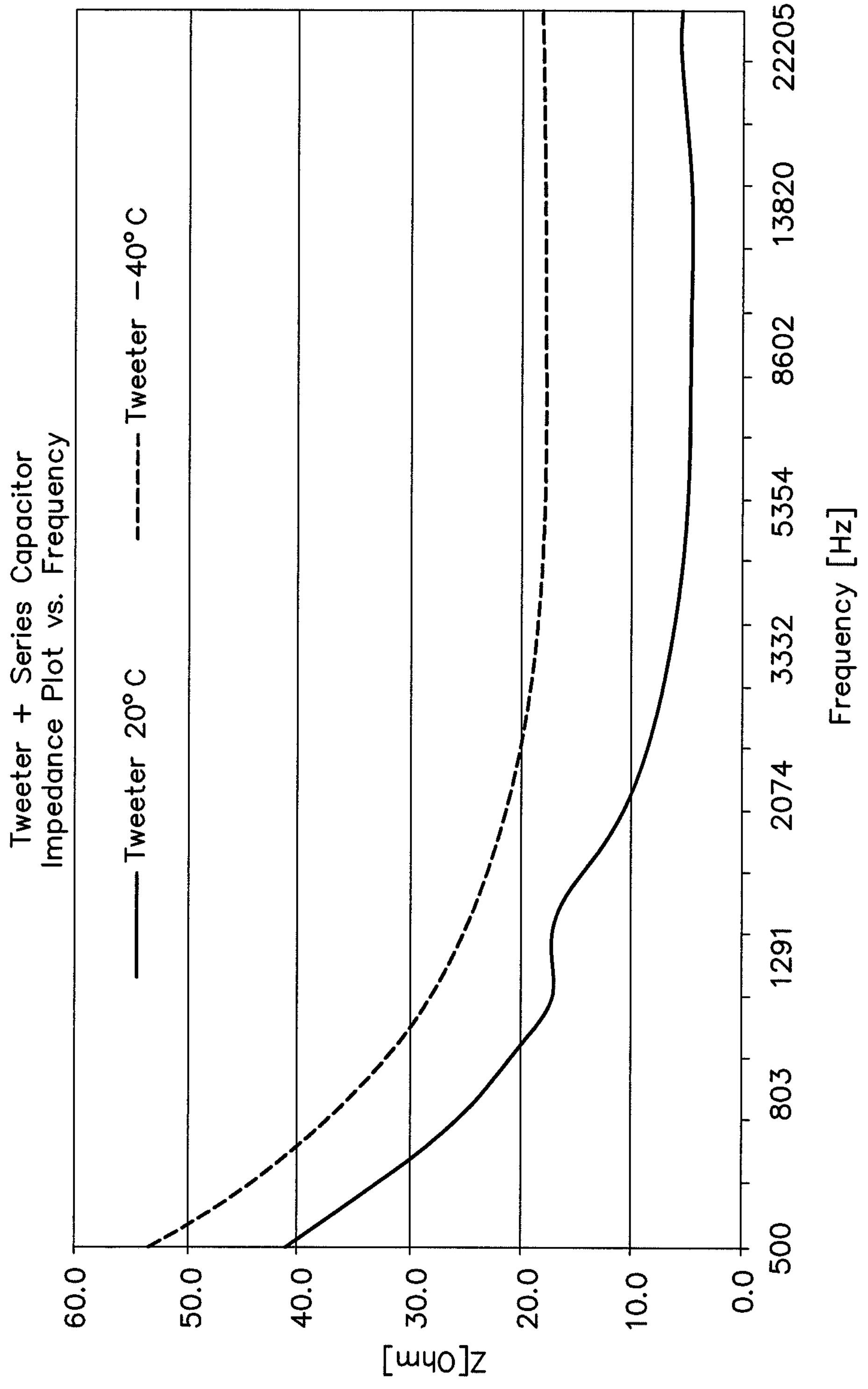
FIG. 9 is a diagram illustrating an impedance-over-frequency curve for a tweeter including a series capacitor at different temperatures.

FIG. 9 illustrates the impedance of a tweeter connected in series to a capacitor as a function of frequency. The equivalent series resistance (ESR) of the capacitor and also its capacitance vary drastically over temperature. For example, two impedance curves are depicted in the diagram of FIG. 9, one impedance curve for +20° Celsius and another for 40° Celsius. The tweeter itself also contributes to the total impedance (of the capacitor and tweeter) but its impedance variation over temperature is much lower than that of the capacitor. The example of FIG. 9 is given to illustrate the advantage of considering the “shape” of the impedance curve instead of the absolute impedance values.

Figure 10:
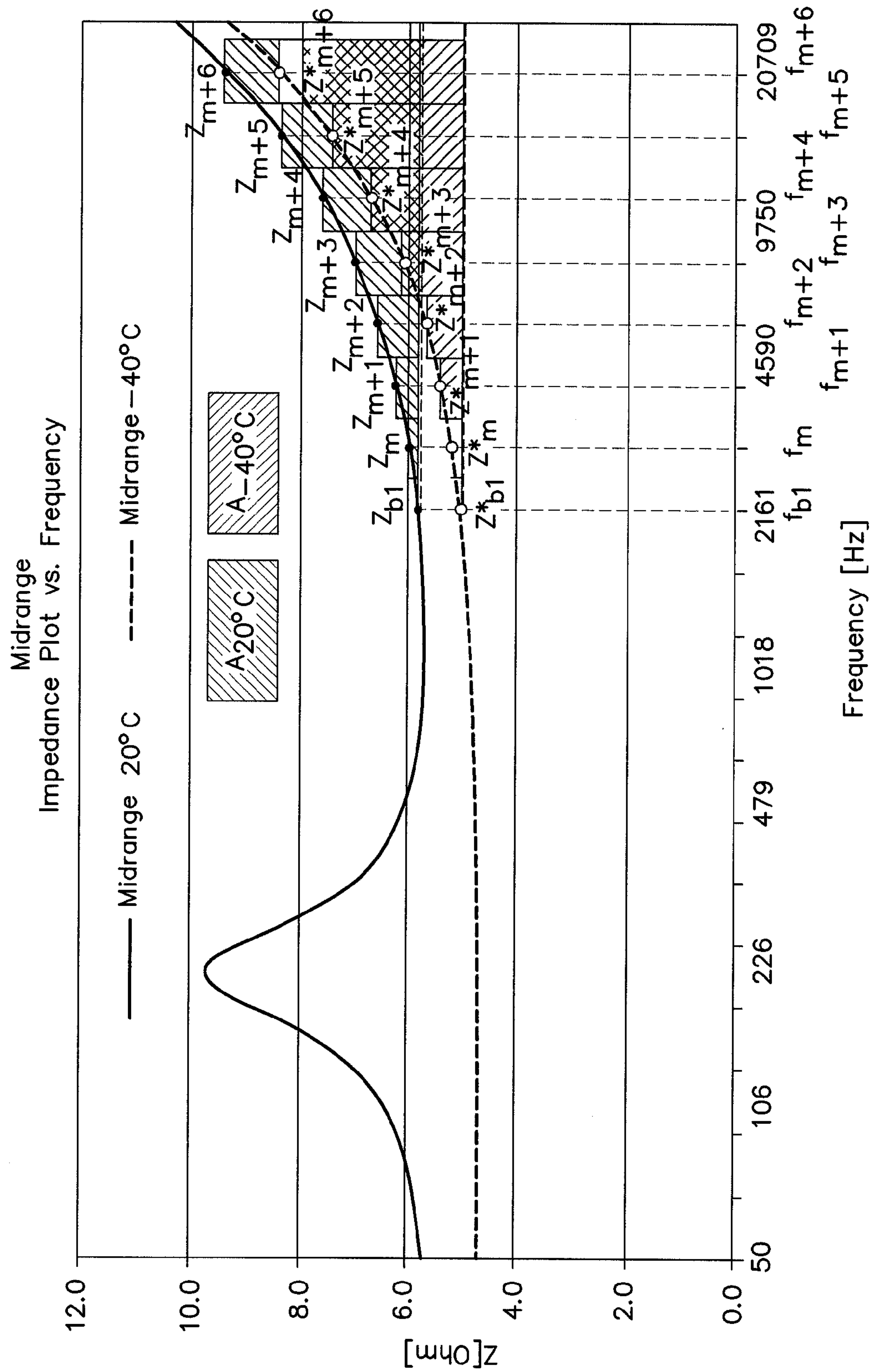
FIG. 10 is a diagram illustrating an impedance-over-frequency curve for a midrange loudspeaker at different temperatures, the area between the curve and a base line being shaded.

FIG. 10 illustrates the impedance of a midrange loudspeaker at different temperatures. Accordingly, the impedance of the midrange loudspeaker also varies over temperature but variations are not as high as the impedance variations of the tweeter including its series capacitor (cf. FIG. 9). At −40° Celsius the midrange loudspeaker loses its “resonance hump” but, apart from that, merely exhibits an offset of about 1 ohm to the impedance curve at +20° Celsius. Also illustrated in FIG. 10 is the area between the impedance curve and a “base line” that represents an impedance threshold which is defined as the impedance $Z_{b1}(f_{b1})$ present at a pre-defined “base frequency” $f_{b1}$. The symbol $Z_{b1}(f_{b1})$ refers to the impedance curve measured at +20° Celsius whereas the symbol $Z^*_{b1}(f_{b1})$ as well as all other symbols with a superscript asterisk refer to the impedance curve measured at −40° Celsius. Although the absolute impedance values $Z_m(f_m)$ change over temperature, the area between the base line and the impedance curve remains almost constant.

Similar to the example discussed with reference to FIGS. 6 to 8 the present example makes use of a characteristic quantity that represents the shape of the impedance curve rather than the impedance values themselves. This characteristic quantity may be, for example, the slope of the curve or an approximation thereof as used in the example of FIGS. 6 to 8 as well as the area between the impedance curve and a threshold represented by a base line. The characteristic quantity used in a specific application may represent the shape of the impedance curve only in a limited frequency range which may be sufficient depending on the requirements of the application.

Figure 12:
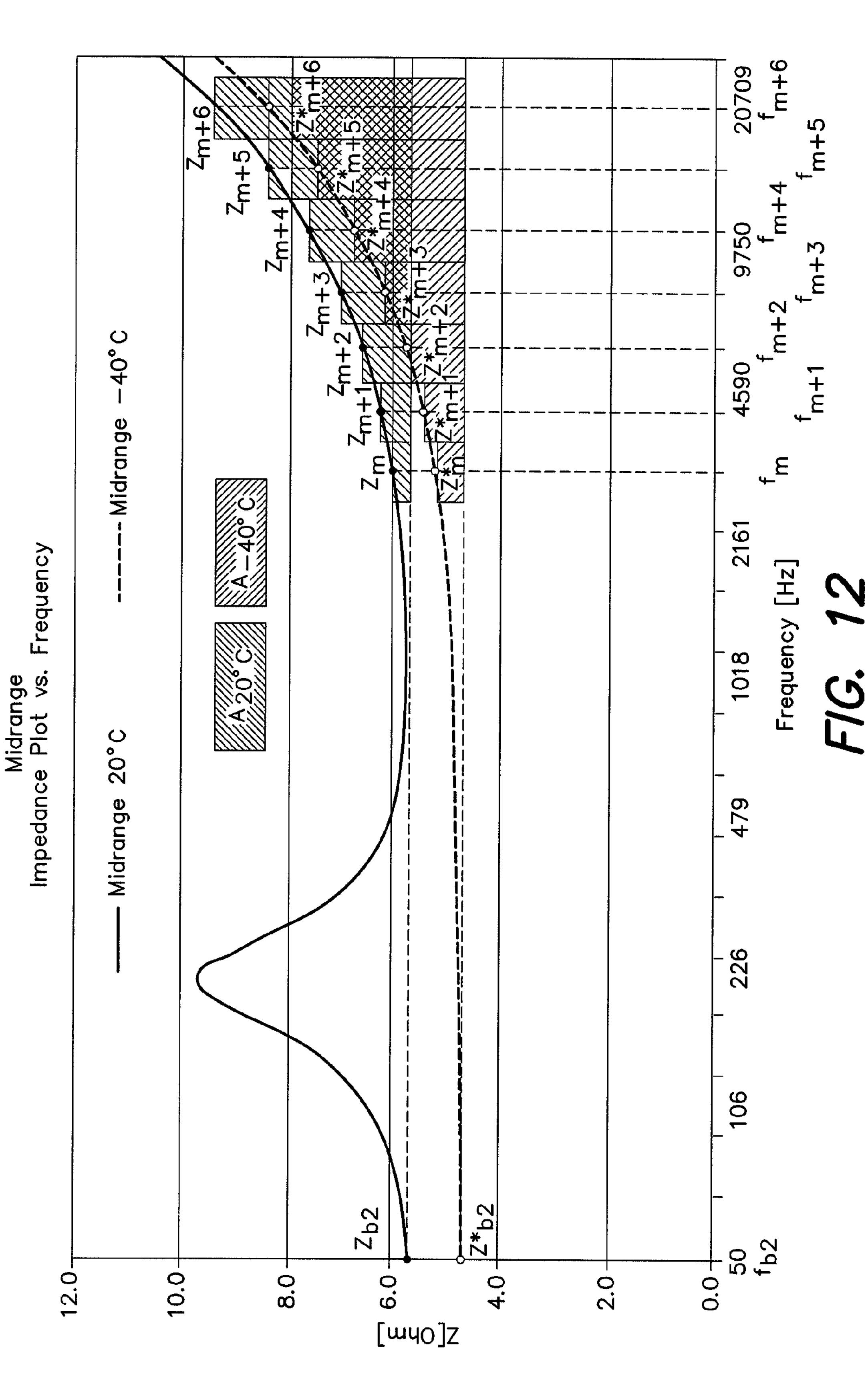
FIG. 12 is a diagram illustrating an impedance-over-frequency curve for a midrange loudspeaker at different temperatures similar to FIG. 11.

In the example of FIG. 10 the sought area is defined by the curve and the threshold $Z_{b1}(f_{b1})$ for frequencies greater than the base frequency $f_{b1}$. In the example of FIG. 12, which illustrates the same midrange loudspeaker impedance, the area is calculated between the impedance curve and the impedance threshold $Z_{b2}(f_{b2})$ which is determined at the base frequency $f_{b2}$. The difference between these two base frequencies will be discussed in the analysis of the resulting areas.

Figure 11:
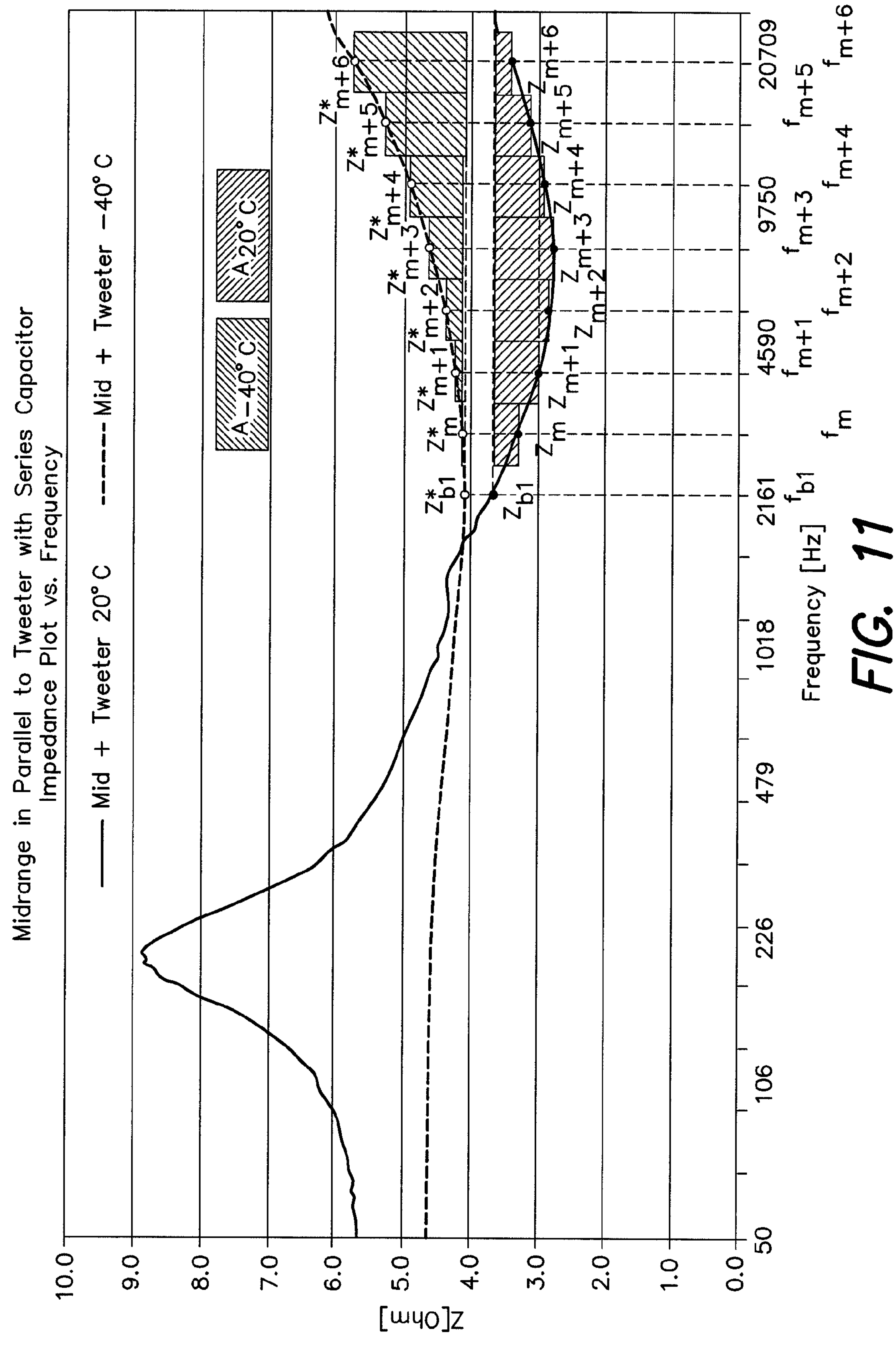
FIG. 11 is a diagram illustrating an impedance-over-frequency curve for a parallel circuit of the midrange loudspeaker and the tweeter including the series capacitor at different temperatures, the area between the curve and a base line being shaded.
Figure 13:
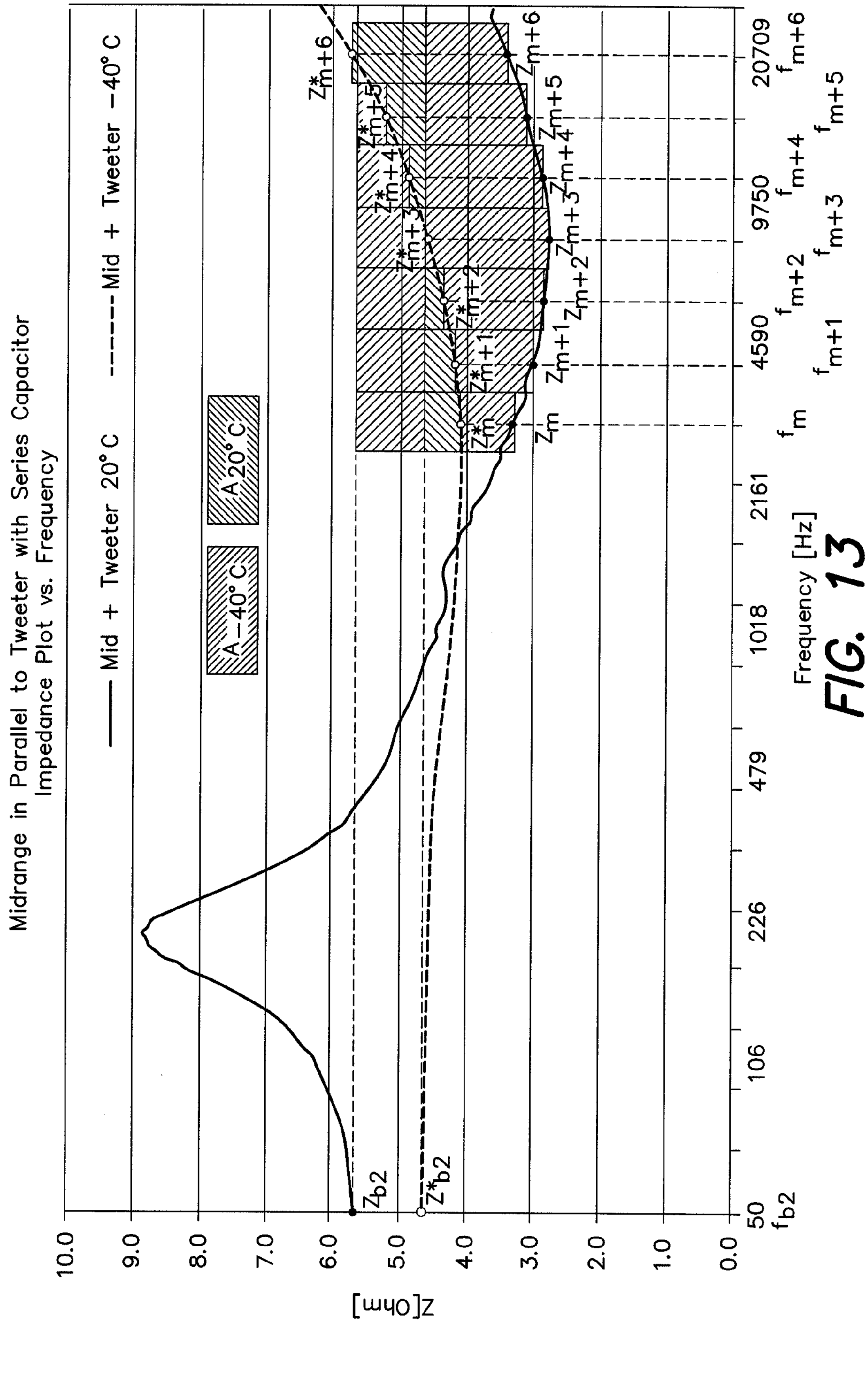
FIG. 13 is a diagram illustrating an impedance-over-frequency curve for a parallel circuit of the midrange loudspeaker and the tweeter including the series capacitor at different temperatures similar to FIG. 11.

FIGS. 11 and 13 illustrate the combined impedance of the midrange loudspeaker (cf. FIGS. 10 and 12) connected in parallel to the tweeter with its series capacitor (see FIG. 9) for temperatures of 20° C. and −40° C. Again the areas between the impedance curves and the impedance base line at $Z_{b1}$ and $Z_{b2}$ are shown for the base frequencies $f_{b1}$ and $f_{b2}$, respectively. It should be noticed that the measurement frequencies ($f_m$ to $f_{m+6}$) for FIG. 10 to FIG. 13 are the same. Only the base frequency is changed ($f_{b1}$, $f_{b2}$) and therefore the impedance base line changes which results in different areas between the impedance base line and the impedance curves.

To determine the impedance base line (i.e., the threshold $Z_{b1}$ or $Z_{b2}$) an impedance measurement at the base frequency $f_{b1}$ or, alternatively, $f_{b2}$ is carried out for example with a test setup as shown in FIG. 4. The measured impedance $Z_{b1}$ or, alternatively, $Z_{b2}$ defines the impedance base line. Afterwards the impedance at the test frequencies $f_m$ to $f_{m+6}$ is measured in the same way resulting in impedance representations $Z_m$ to $Z_{m+6}$. After this step the areas A as shown in FIGS. 10 and 11 are calculated with the equation:

$$A = \sum_{n=0}^{N} (Z_{m+n} - Z_{b1}) \text{ with } N = 6 \qquad \text{(EQ. 1)}$$

For FIGS. 12 and 13 the equation for the resulting area A is:

$$A = \sum_{n=0}^{N} (Z_{m+n} - Z_{b2}) \text{ with } N = 6. \qquad \text{(EQ. 2)}$$

When using frequency values $f_m$, $f_{m+1}$, etc. that are equidistant on the frequency scale of the analyzed impedance curve no multiplication is necessary for computing the area A. If the distances between the (for example logarithmically scaled) test frequencies being geometrically equal this distance can be normalized and set to unity without changing the comparability of the resulting area representations.

It is important to notice that the geometric properties of the load impedances as shown in FIGS. 10 to 13 are based on a logarithmic scale of the frequency axis. Therefore the test frequencies ($f_m$ to $f_{m+6}$) need to be spaced logarithmically in order to obtain a valid result in accordance to the areas illustrated in the frequency plots. However, a linear frequency scale can also be used. Furthermore, the frequency values at which impedance values are measured do not necessarily need to be equidistant in order to provide useful results. However, in this case the resulting “area” value calculated by EQ. 1 or EQ. 2 is not a geometrically interpretable area.

The number of test frequencies $f_{m+n}$, (n=0, 1, . . . ) is determined by the resolution needed in order to differentiate the impedance curves of all load combinations of interest. For the given example the 7 test frequencies used are sufficient even for large tolerances in the load and the measurement system. This will be analyzed in more detail further below.

Figure 14:
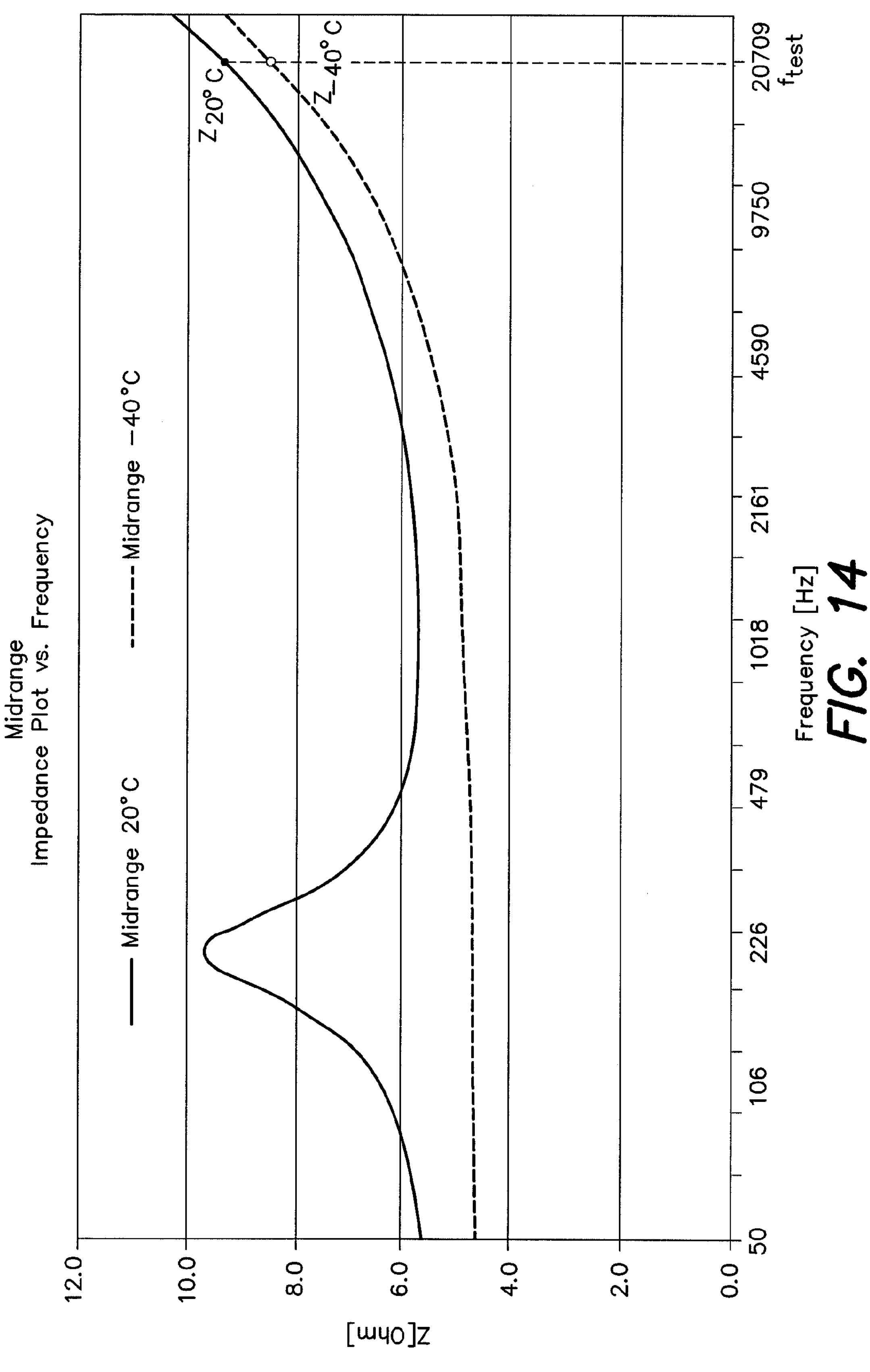
FIG. 14 is a diagram illustrating the single frequency load detection technique applied to an impedance plot of the midrange loudspeaker.
Figure 15:
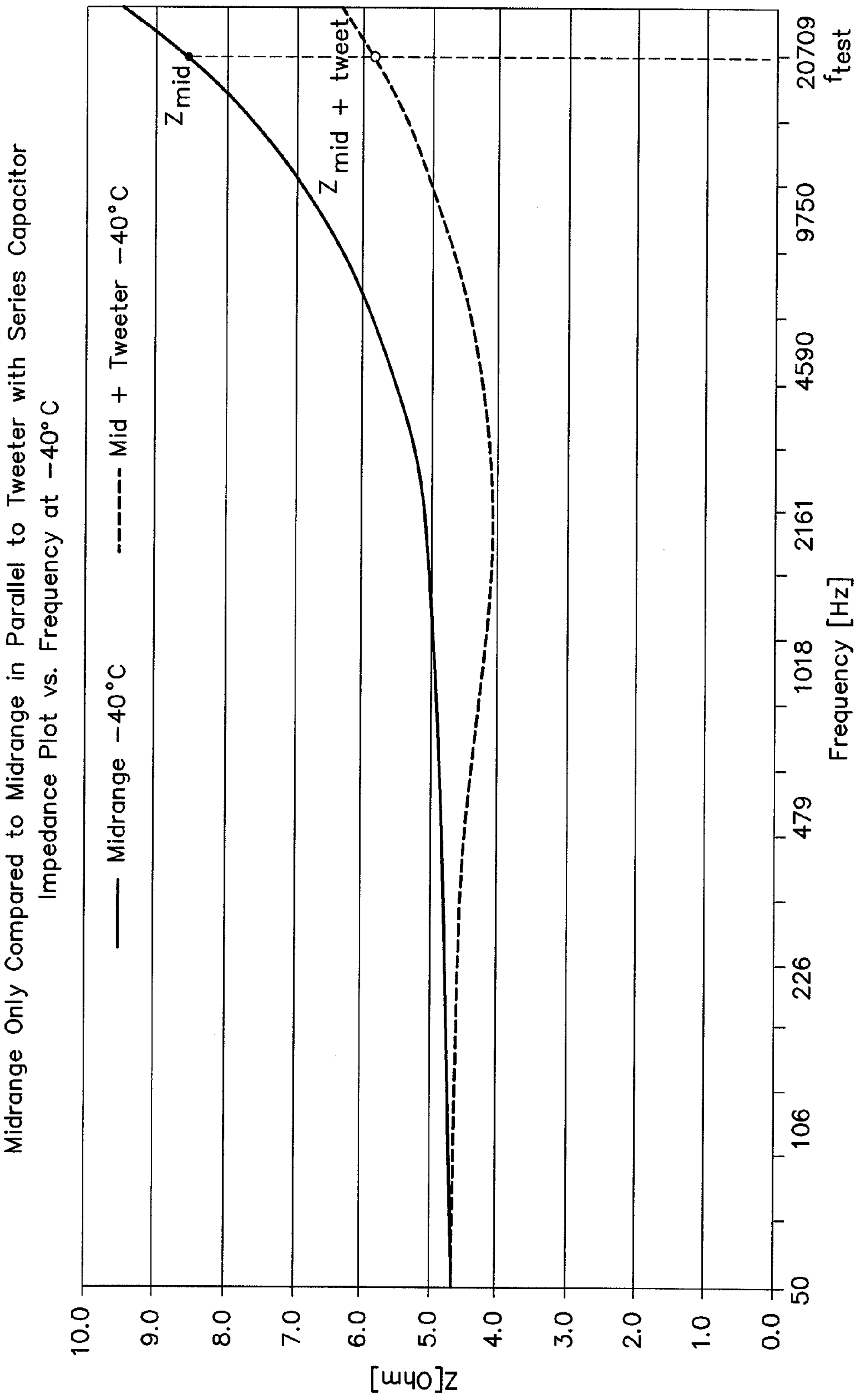
FIG. 15 is a diagram illustrating the single frequency load detection technique applied to an impedance plot of the parallel circuit of the midrange loudspeaker and the tweeter including the series capacitor.

Below, the assessment of the load impedance according to the above example is compared to the classical single frequency load analysis approach. FIG. 14 illustrates the impedance-over-frequency curve of the midrange loudspeaker already mentioned above (cf. FIG. 10). For a single frequency load analysis the test frequency $f_{test}$ of about 20 kHz has been chosen because it is well within the frequency range that a digital audio system with a 44.1 kHz sampling rate can produce and because the impedance at this frequency is considerably different for either the midrange loudspeaker alone or the parallel circuit of the midrange and the tweeter including a series capacitor. In this way the best possible differentiation for the single frequency method is reached. As can be seen in FIG. 15 the minimum difference between the midrange loudspeaker impedance and the impedance of the parallel circuit of the midrange and the tweeter including the series capacitor that occurs at −40° C. increases with an increasing frequency.

The principle of the single frequency load analysis is simple measurement of the absolute impedance at the test frequency and a comparison to an impedance threshold that decides whether only the midrange loudspeaker is connected or both the midrange speaker and the tweeter are connected in parallel. As can be seen from FIG. 15, neglecting any measurement errors and tolerances of the load, a minimum difference of about 2.7 ohms between the two curves exists at the test frequency $f_{test}$. This enables proper differentiation between the above mentioned load configurations (midrange only or midrange and tweeter) only when the tolerance bands of the possible loads do not overlap at the test frequency. However, this is not the case in practice.

Unfortunately real world measurement systems show various degrees of measurement accuracy with a tendency for large measurement errors in inexpensive systems implemented in integrated circuits. Furthermore the load itself may show additional tolerances like part to part variation, aging variations, connector contact resistance and so on. Therefore in the following part of the description it is evaluated how the classical single frequency load analysis approach and the novel approach according to an aspect of the invention handle these tolerances and measurement errors.

The comparison of the different load analysis methods is carried out based on the impedance curves discussed above. For comparison purposes the area between an impedance base line (threshold) $Z_{b1}$ or, alternatively, $Z_{b2}$ and the impedance curves is calculated as explained above (cf. EQ. 1 and EQ. 2). Furthermore, the difference between two impedances at two different frequencies as used in the example of FIGS. 6 to 8 will be evaluated for $f_{b1}$ and $f_{b2}$ each combined with $f_m$.

For the comparison the impedance values of the midrange loudspeaker and the parallel circuit of midrange loudspeaker and tweeter including a series capacitor have been varied between 0% to ±90% as it would be the case for a measurement system with measurement errors or frequency independent tolerances of the load. For the resulting tolerance bands the minimum difference between the two compared load situations has been calculated and displayed versus the applied tolerance in FIG. 16. The point on the abscissa where the minimum difference between the tolerance bands around the two impedance curves to be distinguished becomes zero is the tolerance above which a differentiation between the two load configurations (i.e., midrange speaker alone or midrange speaker and tweeter) is not possible any more.

Figure 16:
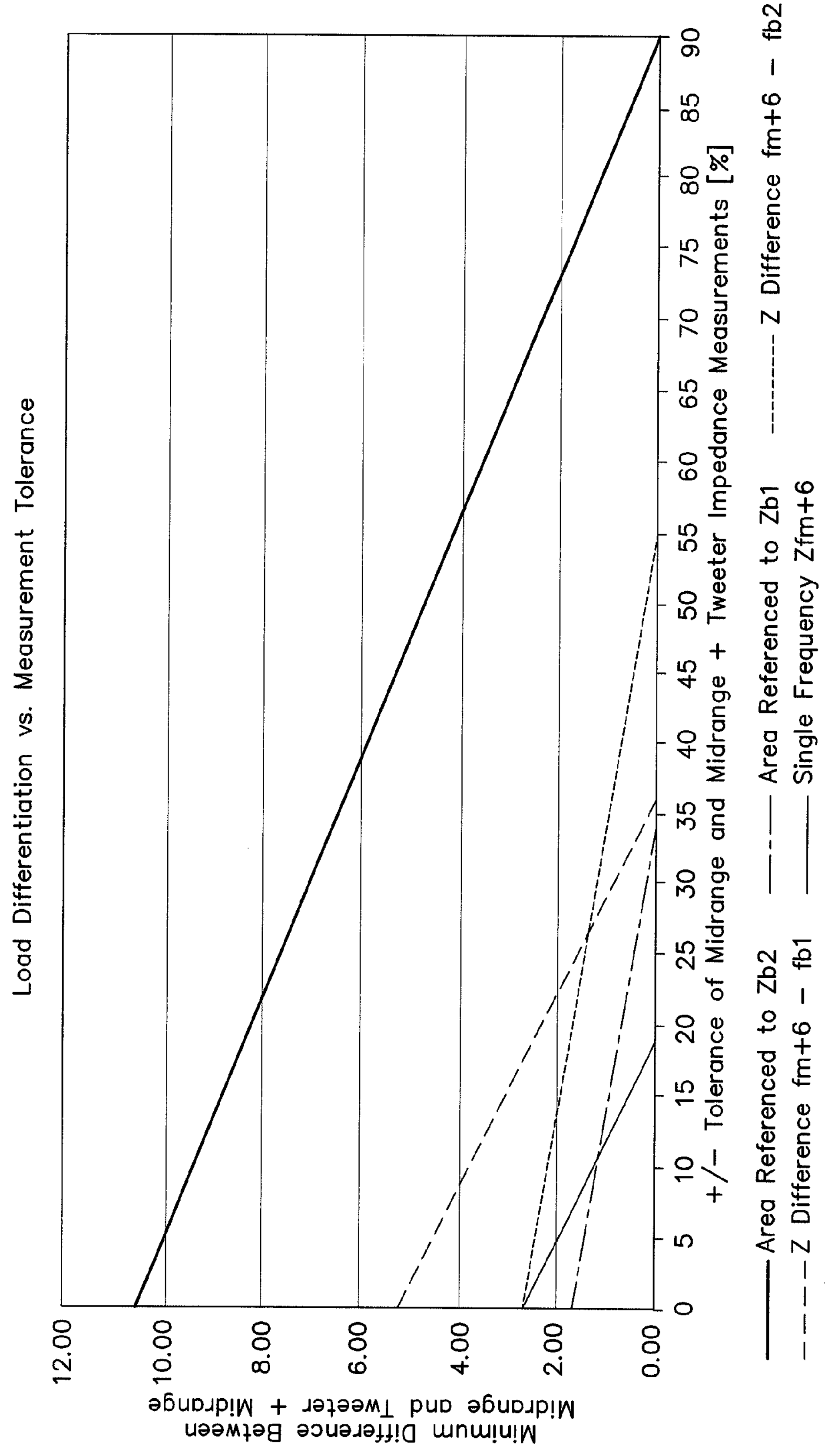
FIG. 16 is a diagram illustrating the allowable tolerances including measurement errors in percent dependent on the load analysis used in order to ensure a reliable load detection.

As can be seen in FIG. 16 for the present example the single frequency load detection has the highest susceptibility to tolerances and errors. Deviations (due to errors and tolerances) greater than about ±18% from the nominal value result in an unreliable or impossible differentiation between the different load configurations. The method that estimates the slope of the impedance curve by calculating the difference $f_{m+2}-f_{b1}$ works up to deviations of ±34% which is an improvement of tolerance susceptibility of 89%. With an operation limit of about ±36% of tolerances the method that considers the area between the horizontal line at impedance $Z_{b1}$ (threshold) and the impedance curve is a still a bit better.

Changing the base frequency to $f_{b2}$ results in a maximum possible tolerance of ±55% for the method that considers the slope estimated by calculating the difference between $Z_{b2}$ and $Z_{m+6}$. For the area method with a base frequency $f_{b2}$ the tolerance can get as high as ±90% before the load differentiation becomes impossible. The susceptibility to tolerances is thus improved by up to a factor of 5 (improvement of 400%) between the classical single frequency load impedance analysis and the method based on the impedance curve shape analysis.

In case of the load being a loudspeaker it is sometimes desired to make the test signal such that it does not disturb humans and animals or, if possible, to make the test signal even inaudible. As has been noted above frequencies (approx. 20 kHz) outside the human-audible audio band can be used. However, if these frequencies are applied to a loudspeaker in form of a sine wave burst that can be seen as a sine wave multiplied by a rectangular window function, the resulting acoustical signal will be a broad spectrum of frequencies around the test signal frequency that eventually will at least overlap the audible audio band.

Figure 17:
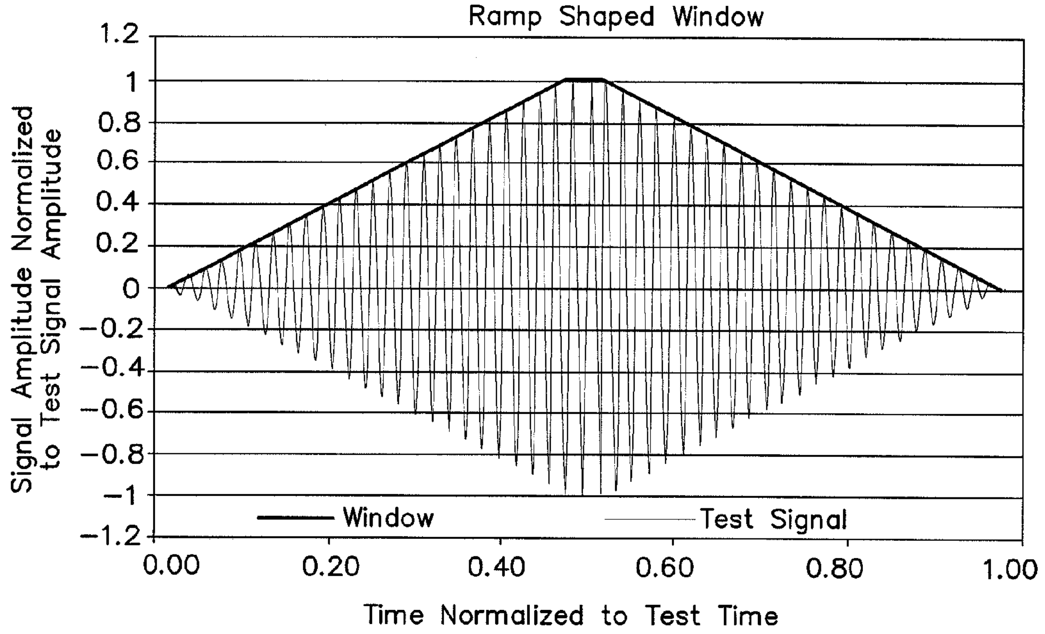
FIG. 17 is a diagram illustrating a test signal with a trapezoid shaped window.
Figure 18:
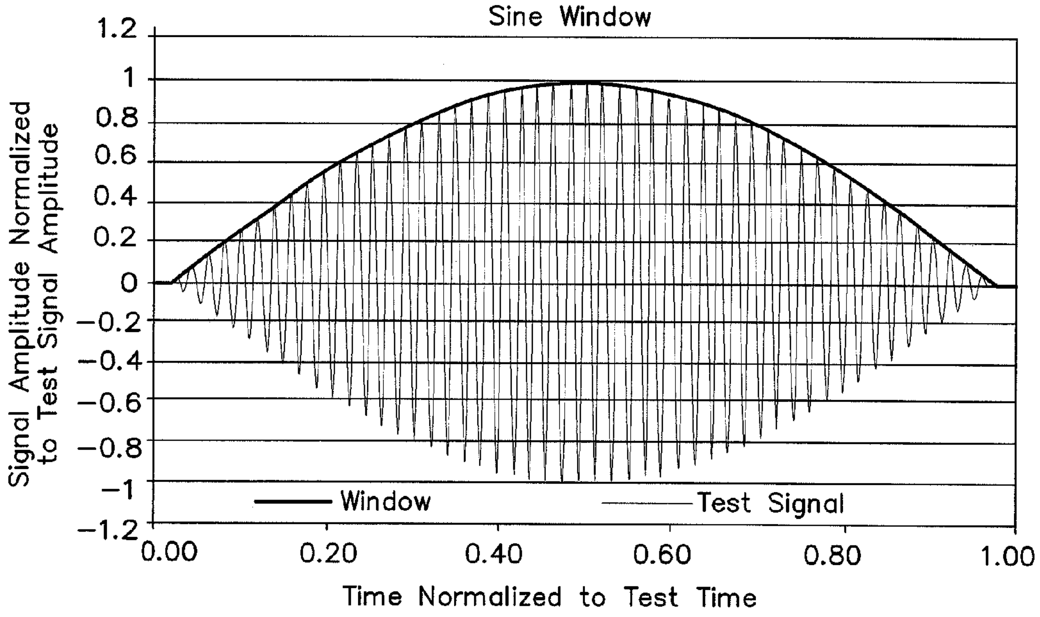
FIG. 18 is a diagram illustrating a test signal with a sine shaped window.

Therefore special window functions may need to be applied that keep the resulting frequency spectrum as narrow as possible. Even if the test frequencies are within the audio band a simple rectangular window can lead to unpleasant pop noises that have to be avoided in some cases. Triangle-, trapezoid-, or sine-shaped window functions have been proven to suppress such pop noise (cf. FIGS. 17 and 18 for respective triangle- or sine-windowed test signals).

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. Such modifications to the inventive concept are intended to be covered by the appended claims.

What is claimed is:

1. A load detection apparatus for a load comprising multiple frequency-dependant sub-loads, the load detection apparatus comprising:

an impedance measuring unit that is connected to the load and measures a representation of the impedance characteristic of the load, and calculates a quantity representing the shape of the impedance characteristic of the load;

a memory unit in which one or more representations of the quantity representing the shape of the impedance characteristic of the load resulting from different configurations of the sub-loads are stored; and a comparison unit that is connected to the impedance measuring unit to receive a representation of the shape of the currently measured impedance characteristic of the load and to the memory unit to receive the stored representations;

where the comparison unit compares the measured representation of the shape with the stored representations and, in case that the measured representation matches one of the stored representations the comparison unit identifies the configuration of the sub-loads within the load where the quantity representing the shape of the impedance characteristic of the load is the slope, or an approximation thereof, of a measured impedance curve at at least one pre-defined base frequency.

2. The apparatus of claim 1, where the different configurations of the sub-loads within the load under test comprises at least one configuration in which at least one sub-load is in a fault condition.

3. A load detection apparatus for a load comprising multiple frequency-dependant sub-loads, the load detection apparatus comprising:

an impedance measuring unit that is connected to the load and measures a representation of the impedance characteristic of the load, and calculates a quantity representing the shape of the impedance characteristic of the load;

a memory unit in which one or more representations of the quantity representing the shape of the impedance characteristic of the load resulting from different configurations of the sub-loads are stored; and a comparison unit that is connected to the impedance measuring unit to receive a representation of the shape of the currently measured impedance characteristic of the load and to the memory unit to receive the stored representations;

where the comparison unit compares the measured representation of the shape with the stored representations and, in case that the measured representation matches one of the stored representations the comparison unit identifies the configuration of the sub-loads within the load, where the quantity representing the shape of the impedance characteristic of the load is the area, or an approximation thereof, between a measured impedance curve and a base line representing a constant threshold impedance measured at a pre-defined base frequency.

4. The apparatus of claim 1, where the slope is approximated as the average slope within a pre-defined frequency interval.

5. The apparatus of claim 1, where the impedance measuring unit comprises a test signal source that generates a narrowband test signal having a frequency that is varied during load detection, and a current sensor that is connected between the test signal source and the load and is adapted to measure the current flowing from the test signal source into the load during load detection.

6. The apparatus of claim 5, where the test signal has an amplitude which is varied during load detection at each one of the frequencies the test signal source is tuned to during load detection and where the comparison unit comprises a comparator that compares the measured current through the load to a threshold at each frequency to provide a representation of the impedance characteristics of the load.

7. The apparatus of claim 5, where the test signal has an amplitude which is constant during load detection at each one of the frequencies the test signal source is tuned to during load detection, and where the comparison unit comprises a peak detector that identifies the peak of the measured current through the load during detection at each frequency to provide a representation of the impedance characteristics of the load.

8. The apparatus of claim 6, where the comparison unit comprises a control logic unit that controls the frequency and amplitude of the test signal source and compares the representations provided by the comparator, with the result thereof with stored representations.

9. The apparatus of claim 8, where the stored representations are part of a truth table that further comprises a list identifying the condition of at least some of the sub-loads.

10. The apparatus of claim 9, where the memory unit is included in the comparison unit.

11. The apparatus of claim 1, where the impedance measuring unit comprises a signal voltage or current measuring unit.

12. The apparatus of claim 11, where at least one of the sub-loads is a loudspeaker.

13. A load detection method for a load comprising multiple frequency-dependant sub-loads, the method comprising:

measuring a representation of the impedance characteristic of the load;

calculating a quantity representing the shape of the impedance characteristic of the load;

providing stored representations of the shape of the impedance characteristics of the load resulting from different configurations of the sub-load; and comparing the calculated quantity of the shape of the current impedance characteristic of the load with each one of the stored representations of the shape and, in case that the measured representation matches a stored representation, identifying the actual configuration of the sub-loads within the load, where the quantity representing the shape of the impedance characteristic of the load is the slope, or an approximation thereof, of a measured impedance curve at at least one pre-defined base frequency.

14. The method of claim 13, where the different configurations of the sub-loads within the load under test comprises at least one configuration in which at least one sub-load is in a fault condition.

15. The method of claim 13, where the slope is approximated as the average slope within a pre-defined frequency interval.

16. The method of claim 13, where the load is an acoustic transducer comprising, as a sub load, at least one loudspeaker, and where the step of measuring a representation of the impedance characteristic of the load comprises providing a test signal having a spectrum that does not overlap with a spectrum audible for humans, whereby the test signal comprises a sinusoidal waveform truncated by a window function.

* * * * *